MANUFACTURE OF THERMOELECTRIC DEVICES

Filed March 29, 1962 3 Sheets-Sheet 1

INVENTOR.
Arthur T. Bassett, Jr.
BY
Carl A Stickel
HIS ATTORNEY

Aug. 3, 1965 A. T. BASSETT, JR 3,197,844

MANUFACTURE OF THERMOELECTRIC DEVICES

Filed March 29, 1962 3 Sheets-Sheet 2

INVENTOR.

Arthur T. Bassett, Jr.

BY

Carl A. Stickel

HIS ATTORNEY

MANUFACTURE OF THERMOELECTRIC DEVICES

Filed March 29, 1962 3 Sheets-Sheet 3

INVENTOR.
Arthur T. Bassett, Jr.
BY
Carl A. Stickel
HIS ATTORNEY

United States Patent Office 3,197,844

Patented Aug. 3, 1965

3,197,844

MANUFACTURE OF THERMOELECTRIC DEVICES

Arthur T. Bassett, Jr., Dayton, Ohio, assignor to General Motors Corporation, Detroit, Mich., a corporation of Delaware Filed Mar. 29, 1962, Ser. No. 183,670
4 Claims. (Cl. 29—155.5)

This invention pertains to refrigerating apparatus and more particularly to the making of thermoelectric devices in which the thermoelectric elements are electrically connected to provide hot junctions and cold junctions on opposite sides of the assembly.

To prepare thermoelectric devices for production, it is necessary to lower the cost of manufacturing to avoid the high cost when made by expensive laboratory methods.

It is an object of this invention to provide a method of making thermoelectric devices by which the elements are assembled and bonded into a unit by low cost mass production methods.

It is another object of this invention to provide a method of making thermoelectric devices requiring a minimum of skill and in which errors are substantially prevented.

It is another object of this invention to provide a method for assuring that the connectors and thermoelectric elements are placed in and held in the proper patterns during the assembly and bonding thereof.

These and other objects are attained in the form shown in the drawings in which a first set of rectangular tin-coated metal connectors are placed into a predetermined pattern and held in locating recesses in a first templet by transverse wire holding members. The second perforated templet is aligned by pins on the first templet. A third perforated templet is aligned by pins with the first and second templet and has apertures arranged in a predetermined pattern for reception of only one type of thermoelectric elements, such as the "P" type elements. The thermoelectric elements of the corresponding type, such as the "P" type, are then placed into the apertures provided by the third templet into contact with the connectors in the recesses of the first templet. The third templet can be turned over or a fourth templet provided for the second type of thermoelectric elements, such as the "N" type elements, which are placed through the perforations in the turned-over third or the fourth templets into contact with the connectors held in the recesses in the first templet. The turned-over third or the fourth templet may then be removed and the assembly is then heated to a sufficient temperature to melt the tin coating to cause the bonding of the "P" and "N" thermoelectric elements to the connectors.

After this, the second set of tin-coated metal connectors are placed into the locating recesses of a fifth templet. The second templet is removed from the first templet with the first set of connectors and both "P" and "N" type elements supported therein and these are inverted as a unit and placed upon the fifth templet with the protruding ends of the "P" and "N" thermoelectric elements extending into contact with the second set of metal connectors retained in a predetermined pattern in the recesses of the fifth templet. The first and fifth templets are aligned by aligning pins to assure the proper orientation of the thermoelectric elements with the second set of connectors. This assembly is then heated to a suitable temperature to cause the thermoelectric elements to be bonded to the second set of connectors by the melting of the tin coating of the connectors. After the bonding is accomplished, the templets are removed and the bonded thermoelectric is placed in a mold and a foam insulating material is cast in between the two sets of connectors and surrounding the thermoelectric elements to provide a durable thermoelectric array.

Further objects and advantages of the present invention will be apparent from the following description, reference being had to the accompanying drawings wherein a preferred embodiment of the present invention is clearly shown.

Figure 14:
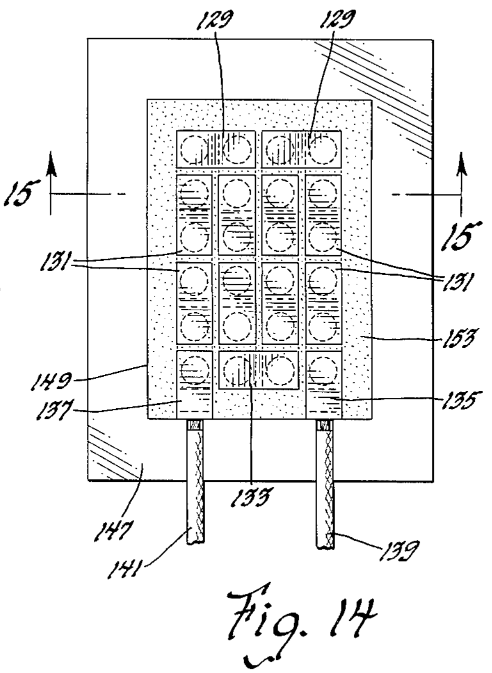
Figure 15:
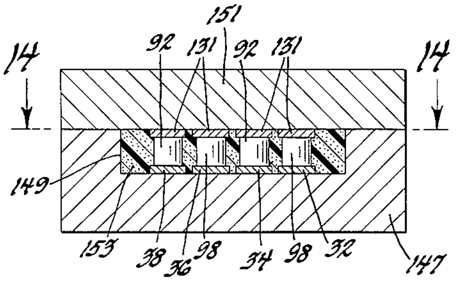
Figure 13:
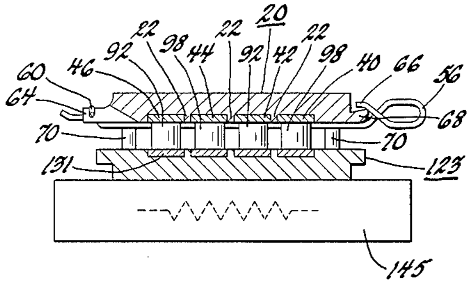

FIGURE 13 is a transverse vertical sectional view with the inverted first templet containing the first set of connectors held therein and the thermoelectric elements bonded to the first set resting upon the metal connectors in the recesses of the fifth templet which in turn rests on a heating device which heats the assembly to accomplish the bonding between the thermoelectric elements and the second set of connectors in the fifth templet;

FIGURE 14 is a top sectional view taken along the parting line 14—14 of FIGURE 15 showing the assembly of first and second sets of connectors bonded to each other and to the thermoelectric elements located in the cavity of a mold into which foam forming electrical and heat insulating materials has been poured surrounding the thermoelectric elements and extending between the two sets of connectors; and FIGURE 15 is a transverse vertical sectional view taken along the line 15—15 of FIGURE 14.

Figures 1, 4:
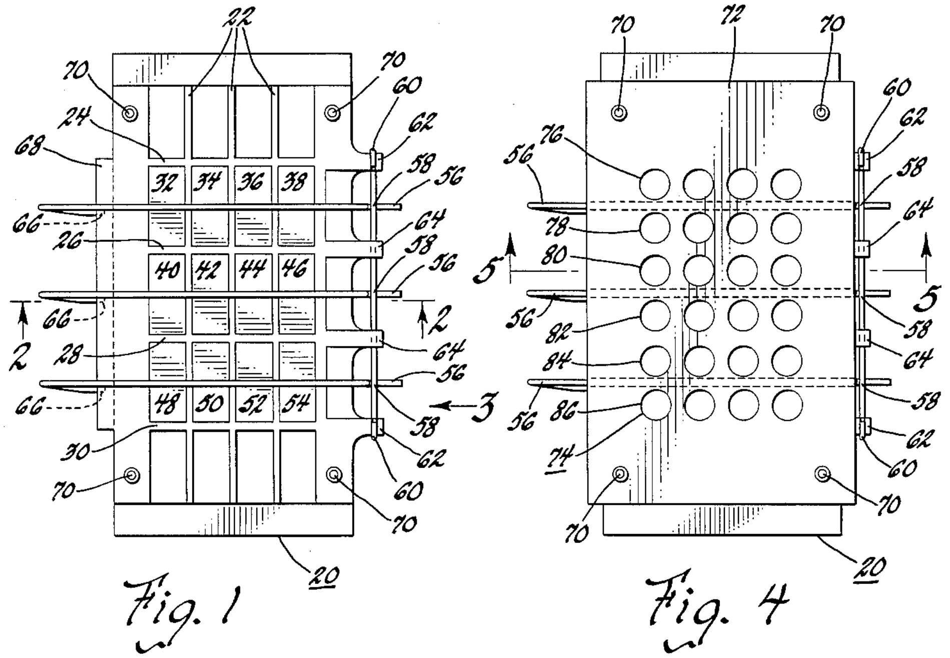
FIGURE 1 is a top view of the recessed face of the first templet containing twelve connectors in the recesses thereof in a predetermined pattern.
FIGURE 4 is a top view of the assembly after the second templet has been applied over the first templet and connectors shown in FIGURE 1.
Figure 2:
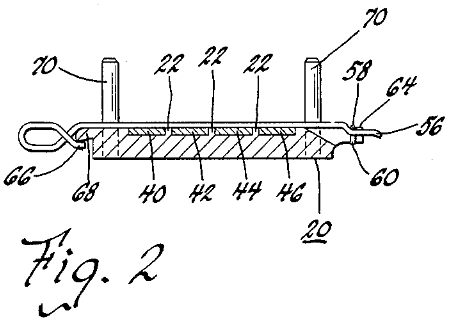
FIGURE 2 is a vertical transverse sectional view taken along the line 2—2 of FIGURE 1 of the first templet and connectors.
Figure 5:
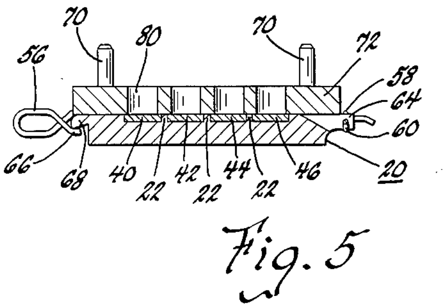
FIGURE 5 is a transverse vertical sectional view taken along the line 5—5 of FIGURE 4.
Figure 3:
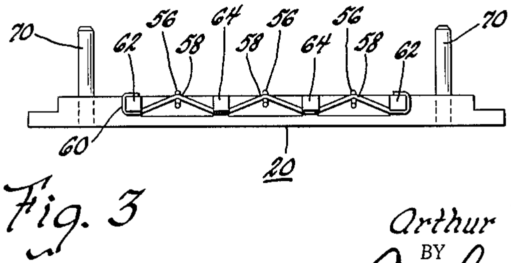
FIGURE 3 is a side view of the first templet shown in FIGURE 1 taken in the direction of arrow 3.

Referring now to the drawings and more particularly to FIGURE 1, there is shown a rectangular templet 20 containing twelve rectangular recesses spaced apart by three longitudinal ribs 22 and the four transverse ribs 24, 26 28 and 30 providing the arrangement of recesses in a predetermined pattern of three rows of four each containing the upper row of four longitudinally positioned rectangular metal connectors 32, 34, 36 and 38 and the middle row of four longitudinally positioned recesses containing rectangular metal connectors 40, 42, 44 and 46 and the bottom row of four longitudinally positioned recesses containing the metal rectangular connectors 48, 50, 52 and 54. These connectors 32 to 54 inclusive are preferably of copper or aluminum, each coated with tin. After these connectors 32 to 54 have been placed into the recesses, they are held therein by the insertion of the three connector retaining springs 56 which have their right ends held beneath the crests 58 of the wire clip 60 having its hook-shaped ends hooked around the projections 62 and having its intermediate trough portions supported by the projections 64. The opposite ends of the connector retaining springs 56 are provided with a loop end having a projecting portion 66 which is looped under the undercut ledge 68 on the left side of the first templet 20 to hold it in place. The templet 20 and its four corners is provided with four upwardly extending locating and aligning pins 70.

After the retaining springs 56 are properly in place holding the connectors 32 to 54 in the recesses provided for them in the desired predetermined pattern, there is slipped onto the four locating pins 70 a second holding templet 72 containing four holes receiving pins 70 to provide the proper alignment with the first templet 20 and also provided with six transverse rows of four holes 74 in which the first and second rows 76 and 78 are located respectively over the upper and lower ends of the connectors 32 to 38. The third and fourth row of holes 80 and 82 are located over the middle row of connectors 42, 46 while the lower two rows 84 and 86 are located over the upper and lower ends of the lower row of connectors 48 to 54. The holes in the second templet 72 are provided for both types of thermoelectric elements namely the "P" and the "N" types. The templet 72 preferably has transverse grooves in its lower face receiving the retaining springs 56.

Figure 6:
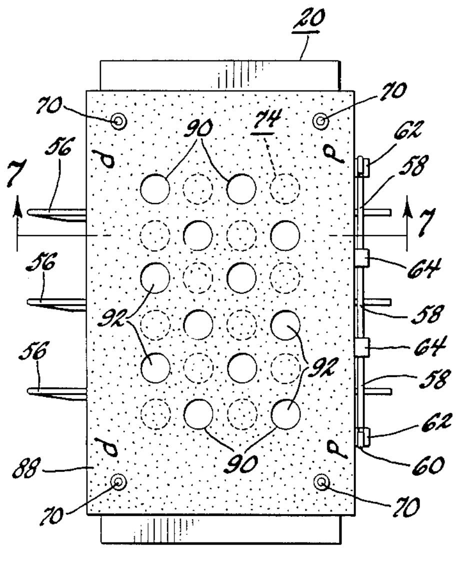
FIGURE 6 is a top view of the assembly after the third templet is applied over the first and second templets.
Figure 7:
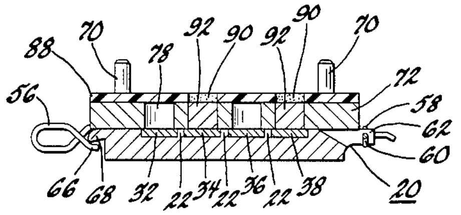
FIGURE 7 is a transverse vertical sectional view taken along the line 7—7 of FIGURE 6.

As shown in FIGURES 6 and 7, in order to assure that only the "P" type thermoelectric elements are placed in the desired pattern of predetermined positions designed for them, there is placed over the second templet 72 a third templet 88 having four locating holes at the corners receiving the four locating pins 70 assuring the proper alignment and orientation with the first and second templets 20 and 72. In this third templet 88, the pattern provides holes over and registering with the first and third holes in the rows 76, 80 and 84 in the templet 72 and the second and fourth holes in the rows 78, 82 and 86 in the templet 72. These holes in the templet 88 are designated by the reference character 90. Placed through the holes 90 in the third templet 88 into the registering holes in the second templet 72 are the cylindrical "P" type thermoelectric elements 92. Since the remaining locating holes of the second templet 72 are blocked by the third templet 88 as shown in FIG. 6, improper location of the "P" type elements 92 is prevented. The lower faces of the "P" type elements 92 rest upon the upper faces of the connectors 32 to 54 held in the first templet 20. The "P" type elements 92 may have their upper and lower faces tin coated. Instead of the tin coating as mentioned throughout this application there may be substituted tin lead coatings or tin indium coatings.

Figure 8:
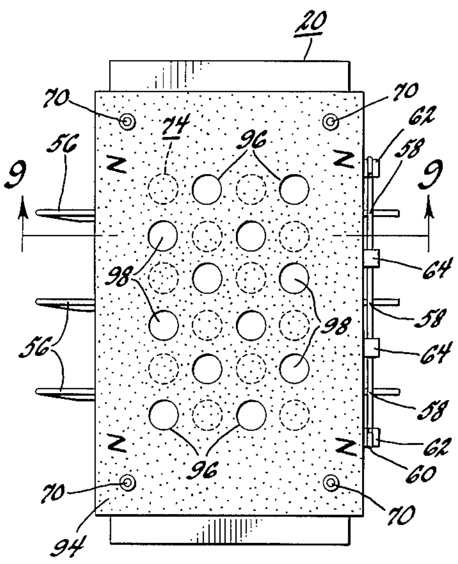
FIGURE 8 is a top view of the assembly after the third templet has been replaced thereon by the fourth templet.
Figure 9:
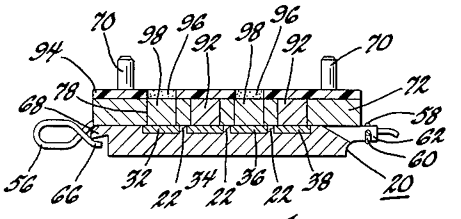
FIGURE 9 is a transverse vertical sectional view taken on the line 9—9 of FIGURE 8.
Figure 10:
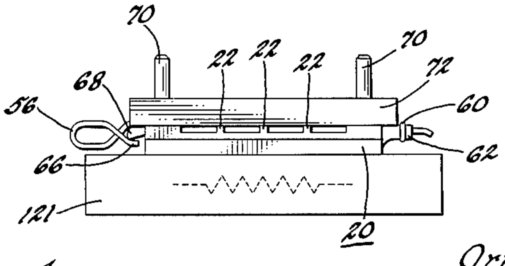
FIGURE 10 is an end view of the assembly with the fourth templet removed resting upon a heating means for heating the assembly to the bonding temperature of the tin coating for bonding the thermoelectric elements to the first set of connectors.

The third templet 88 is then removed and a fourth templet 94 also having four aligning holes receiving the pins 70 is placed in position over the second templet 72 as shown in FIGURES 8 and 9. This fourth templet 94 has holes 96 arranged in a predetermined pattern to register with the second and fourth holes in the transverse rows 76, 80 and 84 of holes in the second templet 72 and the first and third holes in the transverse rows 78, 82 and 86 of the templet 72 to provide the desired predetermined pattern for the positioning of the cylindrical "N" type thermoelectric elements 98. Preferably, their upper and lower faces are tin coated. These "N" type thermoelectric elements 98 are placed through the apertures 96 into the holes 74 of the second templet 72 into contact with the connectors 32 to 54 inclusive. Preferably, the "P" type thermoelectric elements 92 contain 50% bismuth telluride and 50% antimony telluride while the "N" type thermoelectric elements 98 contain about 90% bismuth telluride and 10% antimony telluride doped with between 0.25% and 0.3% copper bromide. Instead of providing a fourth templet 94 as described, the third templet 88 may be inverted and used in the inverted position as the fourth templet in the place of the fourth templet 94. However, in mass production technique wherein each operation would be performed by a separate operator, it would be preferabe to use and provide a separate fourth templet for the templeting of the "N" type thermoelectric elements 98.

After this, the fourth templet 94 (or the third templet if the third templet has been inverted and used in the place of the fourth templet) is removed, the assembly including the first and second templets 20 and 72 and all the connectors 32 to 54 inclusive and thermoelectric elements 92 and 98 arranged and held by the templets 20 and 72 as described previously is placed upon a suitable conduction heating device 121 which raises the temperature of the assembly sufficiently to melt the tin and cause bonding of all the thermoelectric elements to all the connectors with which they are in contact. This causes the tin coating to bond thermoelectric elements to the connectors. Although tin is preferred, other bonding metals, alloys and materials may be used if desired to provide bonding of the thermoelectric elements to the connectors.

Figure 11:
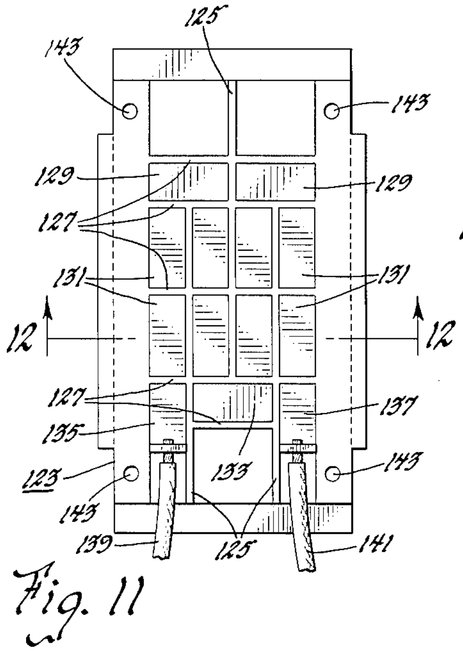
FIGURE 11 is a top view of the recessed face of the fifth templet containing eleven metal connectors in the recesses thereof in a predetermined pattern.
Figure 12:
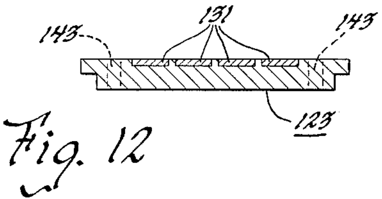
FIGURE 12 is a transverse vertical sectional view taken along the line 12—12 of FIGURE 11.

Referring now more particularly to FIGURES 11 and 12, the fifth templet 123 of aluminum or other suitable metal is provided with longitudinal ribs 125 and horizontal ribs 127 dividing the upper surfaces into two upper transverse recesses receiving the tin-coated metal connectors 129 arranged in an upper row of two and two rows of four longitudinally positioned recesses receiving the tin-coated rectangular metal connectors 131. In addition, there is a single centrally located transversely positioned rectangular recess receiving a tin-coated metal connector 133 positioned below the connectors 131. These connectors 129 and 131 and 133 are placed into the positions shown in FIGURE 11. In addition, there is also provided on either side of the connector 133 longitudinally positioned recesses for receiving the terminal connectors 135 and 137 which are longitudinally positioned and before or afterward are preferably connected to the conductors 139 and 141. The fifth templet 123 contains four corner holes 143 which are adapted to receive the locating and aligning pins 70 projecting from the first templet.

The second templet 72 is then removed from the first templet. The first templet with the thermoelectric elements 92 and 98 and the connectors 32 to 54 held in place by the spring mounting clips 56 is inverted as a unit and the locating and aligning pins 70 passed through the corner apertures 143 in the temple 123 so as to place the thermoelectric elements 92 and 98 with their exposed ends in contact with the ends of the connectors 125 to 137 inclusive which are held within the recesses in the fifth templet 123 as shown in FIGURE 13. Thereafter, the heating means 145 is operated at a sufficiently high temperature for a sufficient time to heat the templets 123 and 20 and particularly the connectors 129 to 137 and the adjacent portions of the thermoelectric elements 92 and 98 until the tin melts and bonds the connectors 129 to 137 inclusive to the contacting portions of the thermoelectric elements 92 and 98. After the bonding is completed by the cooling and solidification of the tin coating, the completed thermoelectric array composed of the connectors 24 to 34 inclusive, the thermoelectric elements 92 and 98 and the connectors 129 to 137 inclusive is removed by the moving of the templet 123 and the clips 56 from the first templet 20. The thermoelectric array is thus complete.

However, for better heating and cooling, the array is placed in the recess 149 in the lower part of a mold 147. A foam forming electrical and heat insulating plastic resin 153, such as polyurethane, is introduced into the recess and the recess is closed by the upper portion 151 of the mold. The foaming resin 153 surrounds and electrically and heat insulates the thermoelectric elements 92 and 93 and structurally bonds together and structurally reinforces all parts of the array to form a unit which can be readily handled with considerably less risk of breakage. After setting and proper curing, the unit is removed from the mold 147.

While the embodiment of the present invention, as herein disclosed, constitutes a preferred form, it is to be unerstood that other forms might be adopted.

What is claimed is as follows:

1. The method of making a thermoelectric array which includes placing and holding a first set of metal connectors in spaced relation in a predetermined pattern, placing and holding a first type of thermoelectric elements in a first pattern of predetermined positions in contact with said first set of connectors while blocking the location of the first type elements in any other positions, placing and holding a second type of thermoelectric elements in a second pattern of predetermined positions in contact with said connectors while the first type elements and the connectors are being held in said patterns, and while said elements and said first set of connectors are being held in said patterns bonding at substantially the same time the first and second types of elements to the connectors with which they are in contact, placing and holding a second set of metal connectors in spaced relation in a predetermined pattern and while maintaining the spacing and the pattern bonding said second set of connectors at substantially the same time to the first and second type elements.

2. The method of making a thermoelectric array which includes placing and holding a first set of metal connectors in spaced relation in a first templet having provisions for spacing and holding the first set of connectors in a predetermined pattern, placing and holding a first type of thermoelectric elements in a first pattern of predetermined positions with one in contact with each of said first set of connectors while in said first templet and blocking the placing of the first elements in any other positions, placing and holding a second type of thermoelectric elements in a second pattern of predetermined positions with one in contact with each of said first set of connectors while in said first templet, bonding at substantially the same time all the first and second types of elements to the connectors with which they are in contact while they are held in said first templet, placing and holding a second set of metal connectors in spaced relation in a second predetermined pattern in a second templet and while so held bonding at substantially the same time said second set of connectors to said first and second types of elements.

3. The method of making a thermoelectric array which includes placing and holding a first set of metal connectors in spaced relation in a predetermined pattern, aligning with said first set of connectors a holder having perforations arranged in a predetermined pattern for two types of thermoelectric elements, aligning with said holder a first template having aligned perforations only for a first type of thermoelectric elements arranged in a first pattern of predetermined positions, passing first type thermoelectric elements through the perforations in said first template into the aligned perforations in said holder, removing said first template from said aligning relationship and passing the second type of thermoelectric elements into the remaining unfilled perforations in said holder, and while said first and second type of thermoelectric elements are held by said holder in proper relation to said first set of connectors bonding said first and second type of thermoelectric elements to said first set of metal connectors, then removing said holder from said thermoelectric elements, placing and holding a second set of metal connectors in spaced relation in a second predetermined pattern, and while said second set is so held bonding said second set to said thermoelectric elements.

4. The method of making a thermoelectric array which includes placing and holding a first set of metal connectors in spaced relation in a predetermined pattern, aligning with said first set of connectors a holder having perforations arranged in a predetermined pattern for two types of thermoelectric elements, aligning with said holder a first template having aligned perforations only for a first type of thermoelectric elements arranged in a first pattern of predetermined positions, passing first type thermoelectric elements through the perforations in said first template into the aligned perforations in said holder, removing said first template from said aligning relationship and aligning with said holder a second template having perforations only for a second type of thermoelectric elements arranged in a second pattern of predetermined positions, passing the second type of thermoelectric elements through the perforations in said second template into the aligned perforations in said holder, and while said first and second type of thermoelectric elements are being held in proper relation to said first set of connectors bonding said first and second type of thermoelectric elements to said first set of connectors, then removing said second template and said holder from said thermoelectric elements, placing and holding a second set of metal connectors in spaced relation in a second predetermined pattern, and while said second set is so held bonding said second set to said thermoelectric elements.

References Cited by the Examiner

UNITED STATES PATENTS

| | | | |
|---|---|---|---|
| 2,959,848 | 11/60 | Savitt | 29—407 |
| 2,970,370 | 2/61 | Weaver et al. | 29—211 |
| 2,980,746 | 4/61 | Claydon. | |

OTHER REFERENCES

"Cable Connections the Easy Way" Electronic Design, page 24, Oct. 15, 1958.

WHITMORE A. WILTZ, *Primary Examiner.*